(12) United States Patent
Luttrell et al.

(10) Patent No.: US 11,779,816 B2
(45) Date of Patent: *Oct. 10, 2023

(54) LASER-CONTRASTED GOLF CLUB HEAD AND MANUFACTURING PROCESS

(71) Applicant: Acushnet Company, Fairhaven, MA (US)

(72) Inventors: Stephanie Luttrell, Carlsbad, CA (US); Vincent Jacobson, Murrieta, CA (US); Kevin Wolfe, Fallbrook, CA (US)

(73) Assignee: Acushnet Company, Fairhaven, MA (US)

( * ) Notice: Subject to any disclaimer, the term of this patent is extended or adjusted under 35 U.S.C. 154(b) by 18 days.

This patent is subject to a terminal disclaimer.

(21) Appl. No.: 17/525,231

(22) Filed: Nov. 12, 2021

(65) Prior Publication Data

US 2022/0134192 A1 May 5, 2022

Related U.S. Application Data

(63) Continuation of application No. 16/901,876, filed on Jun. 15, 2020, now Pat. No. 11,202,944.

(51) Int. Cl.
*A63B 53/04* (2015.01)
*C23C 14/02* (2006.01)

(52) U.S. Cl.
CPC ............ *A63B 53/04* (2013.01); *C23C 14/028* (2013.01); *A63B 53/0441* (2020.08); *A63B 2209/00* (2013.01)

(58) Field of Classification Search
CPC . A63B 53/04; A63B 53/0441; A63B 2209/00; A63B 53/0445

USPC ......................................................... 473/331
See application file for complete search history.

(56) References Cited

U.S. PATENT DOCUMENTS

| | | | |
|---|---|---|---|
| 2,005,401 A | | 6/1935 | Storz |
| 4,792,140 A | * | 12/1988 | Yamaguchi ............ A63B 53/04 473/331 |
| D349,934 S | | 8/1994 | Feche |
| D352,983 S | | 11/1994 | Williams |
| 5,709,617 A | | 1/1998 | Nishimura |
| D437,376 S | | 2/2001 | Solheim |
| D437,904 S | | 2/2001 | Galloway |
| D437,905 S | | 2/2001 | Galloway |
| D443,323 S | | 6/2001 | Solheim |
| D446,834 S | | 8/2001 | Hocknell |
| D447,527 S | | 9/2001 | Hocknell |

(Continued)

*Primary Examiner* — Sebastiano Passaniti

(57) ABSTRACT

A golf club head having a laser-generated features to create contrast on the club face of the golf club head. The club face includes a central region, a toe region, and a heel region. The central region includes a first plurality of laser-generated features that provide a height-intersection coverage of the central region, a width-intersection coverage of the central region, and a surface-area coverage of the central region. The toe region includes a second plurality of laser-generated features that provide a height-intersection coverage of the toe region, a width-intersection coverage of the toe region, and a surface-area coverage of the toe region. The heel region includes a third plurality of laser-generated features that provide a height-intersection coverage of the heel region, a width-intersection coverage of the heel region, and a surface-area coverage of the heel region.

20 Claims, 9 Drawing Sheets

(56) References Cited

U.S. PATENT DOCUMENTS

| | | |
|---|---|---|
| D447,528 S | 9/2001 | McCabe |
| 6,309,310 B1 | 10/2001 | Shira |
| D457,585 S | 5/2002 | Smith |
| D457,930 S | 5/2002 | Saracco |
| D464,097 S | 10/2002 | Burrows |
| D467,293 S | 12/2002 | Madore |
| D474,824 S | 5/2003 | Poynor |
| D474,825 S | 5/2003 | Poynor |
| D475,105 S | 5/2003 | Helmstetter |
| D482,094 S | 11/2003 | Burrows |
| D487,126 S | 2/2004 | Sanchez |
| D487,787 S | 3/2004 | Cleveland |
| 6,719,644 B2 | 4/2004 | Beach |
| 6,852,041 B1 | 2/2005 | Huang |
| D503,761 S | 4/2005 | Tuerschmann |
| D503,762 S | 4/2005 | Wood |
| D504,480 S | 4/2005 | Nishitani |
| D504,481 S | 4/2005 | Nishitari |
| D508,102 S | 8/2005 | Poynor |
| D510,396 S | 10/2005 | Rollinson |
| D511,361 S | 11/2005 | Brookshire |
| D513,052 S | 12/2005 | Tuerschmann |
| D521,585 S | 5/2006 | Hasebe |
| D524,391 S | 7/2006 | Hasebe |
| D527,780 S | 9/2006 | Sanchez |
| D530,763 S | 10/2006 | Evans |
| D534,977 S | 1/2007 | Evans |
| D538,870 S | 3/2007 | Chick |
| D544,935 S | 6/2007 | Chick |
| D544,936 S | 6/2007 | Chick |
| D545,390 S | 6/2007 | Kuan |
| D560,737 S | 1/2008 | Roberts |
| D568,428 S | 5/2008 | Hooley |
| D569,466 S | 5/2008 | Hooley |
| 7,576,298 B2 | 8/2009 | Erb |
| 8,021,245 B2 * | 9/2011 | Beach ............... A63B 60/00 473/331 |
| 8,636,607 B2 | 1/2014 | Renna |
| 8,827,832 B2 | 9/2014 | Breier |
| 8,827,833 B2 | 9/2014 | Amano |
| 8,858,361 B2 | 10/2014 | Ripp |
| 8,979,670 B2 | 3/2015 | Aguayo |
| 9,005,046 B2 | 4/2015 | Thomas |
| D732,125 S | 6/2015 | Trahan |
| 9,162,116 B2 | 10/2015 | Carlyle |
| D759,175 S | 6/2016 | Trahan |
| D764,613 S | 8/2016 | Noyes |
| 9,427,632 B2 | 8/2016 | Breier |
| 9,504,885 B2 | 11/2016 | Ban |
| 9,533,202 B2 | 1/2017 | Belvins |
| 10,232,231 B2 | 3/2019 | Jertson |
| 10,252,120 B2 | 4/2019 | Ban |
| 10,343,034 B2 * | 7/2019 | Henrikson ............ B23P 15/00 |
| 10,905,924 B2 | 2/2021 | Henrikson |
| 11,202,944 B1 * | 12/2021 | Luttrell ............ C23C 14/5873 |
| 11,504,585 B2 * | 11/2022 | Luttrell ............ A63B 53/0445 |
| 2002/0049095 A1 | 4/2002 | Galloway |
| 2003/0032498 A1 | 2/2003 | Erb |
| 2008/0051212 A1* | 2/2008 | Voges ............... A63B 53/0466 473/331 |
| 2011/0045920 A1 | 2/2011 | Oldknow |
| 2012/0264537 A1 | 10/2012 | Breier |
| 2013/0053169 A1 | 2/2013 | Dumas |
| 2016/0067558 A1 | 3/2016 | Trahan |
| 2017/0080299 A1 | 3/2017 | Trahan |
| 2019/0175998 A1 | 6/2019 | Kitagawa |

* cited by examiner

LASER-CONTRASTED GOLF CLUB HEAD AND MANUFACTURING PROCESS

CROSS-REFERENCE TO RELATED APPLICATIONS

This application is a continuation of U.S. patent application Ser. No. 16/901,876 filed Jun. 15, 2020, entitled "Laser-Contrasted Golf Club Head and Manufacturing Process," which is incorporated herein by reference in its entirety.

BACKGROUND

A golf club head includes a "sweet spot" that is the optimal point for which a golf ball should be struck by the golf club head to produce the best results. The size and location of the sweet spot may change depending on the particular golf club head. A golf club head also includes other characteristics, such as loft, bulge, and roll. The loft of a golf club head is the angle formed by the intersection of the plane of the clubface and the line of the shaft. The bulge of the club face is the curvature of the club face from the heel to the toe, and the roll of the club face is the curvature of the club face from the crown to the sole.

SUMMARY

In an aspect, the technology relates to a golf club head that includes a crown, a sole, and a club face, attached to the crown and the sole. The club face includes a central region, a toe region, and a heel region. The central region includes a first plurality of laser-generated features that provide at least one of a height-intersection coverage of the central region of at least 80%, a width-intersection coverage of the central region of at least 80%, or a surface-area coverage of the central region of at least 25%. The toe region includes a second plurality of laser-generated features that provide at least one of a height-intersection coverage of the toe region of at least 50%, a width-intersection coverage of the toe region of at least 50%, or a surface-area coverage of the toe region of at least 25%. The heel region includes a third plurality of laser-generated features that provide at least one of a height-intersection coverage of the heel region of at least 50%, a width-intersection coverage of at least 50%, or a surface-area coverage of the heel region of at least 25%.

In an example, the height-intersection coverage of the central region is at least 90% and the width-intersection coverage of the central region is at least 90%. In another example, the surface-area coverage of the central region is at least 25%. In still another example, the surface-area coverage of the central region is at least 50%. In yet another example, the club face has a maximum width in a heel-to-toe direction, and the central region has a maximum width between 30-50% of the maximum width of the club face. In a further example, the first plurality of laser-generated features is covered with a physical vapor deposition (PVD) coating.

In another example, the second plurality of laser-generated features is not covered with a PVD coating. In a further example, the PVD coating is a dark coating, and the first plurality of laser-generated features appear darker than the second plurality of laser-generated features due to the PVD coating covering the first plurality of laser-generated features, thereby creating contrast between the central region and the toe region. In still another example, a portion of the first plurality of laser-engraved features is covered by crown paint.

In another example, the technology relates to a golf club head including a crown, a sole, and a club face, attached to the crown and the sole, including a central region, a toe region, and a heel region. The central region includes a first plurality of laser-generated features that provide at least two of a height-intersection coverage of the central region of at least 90%, a width-intersection coverage of the central region of at least 90%, or a surface-area coverage of the central region of at least 25%. The toe region includes a second plurality of laser-generated features that provide at least two of a height-intersection coverage of the toe region of at least 60%, a width-intersection coverage of the toe region of at least 60%, or a surface-area coverage of the toe region of at least 10%. The heel region includes a third plurality of laser-generated features that provide at least two of a height-intersection coverage of the heel region of at least 60%, a width-intersection coverage of at least 60%, or a surface-area coverage of the heel region of at least 10%.

In an example, the height-intersection coverage of the central region is at least 90% and the width-intersection coverage of the central region is at least 90%. In another example, the surface-area coverage of the central region is at least 50%. In still another example, the first plurality of laser-generated features is covered with a physical vapor deposition (PVD) coating; the second plurality of laser-generated features is not covered with a PVD coating; and the first plurality of laser-generated features appear darker than the second plurality of laser-generated features due to the PVD coating covering the first plurality of laser-generated features, thereby creating contrast between the central region and the toe region. In yet another example, the first plurality of laser-generated features is a first color and the second plurality of laser-generated features is a second color.

In another aspect, the technology relates to a method for manufacturing a golf club head. The method includes generating, by one or more lasers, a first plurality of laser-generated features on a central region of a club face, wherein the first plurality of laser-generated features provide at least one of a height-intersection coverage of the central region of at least 80%, a width-intersection coverage of the central region of at least 80%, or a surface-area coverage of the central region of at least 50%. The method also includes applying a coating to the club face such that the coating covers the first plurality of laser-generated features. The method further includes generating, by the one or more lasers, a second plurality of laser-generated features on a toe region of the club face, wherein generating the second plurality of laser-generated features removes portions of the coating on the toe region; and generating, by the one more lasers, a third plurality of laser-generated features on a heel region of the club face, wherein generating the second plurality of laser-generated features removes portions of the coating on the heel region.

In an example, the coating is a PVD coating and the first plurality of laser-generated features appear darker than the second plurality of laser-generated features, thereby creating contrast between the central region and the toe region. In another example, the first plurality of laser-generated features and the second plurality of laser-generated features is generated from the same laser. In a further example, the height-intersection coverage of the central region is at least 90% and the width-intersection coverage of the central region is at least 90%. In still another example, the surface-area coverage of the central region is at least 15%. In yet another example, the method further includes painting a crown of the golf club head such that a portion of the first plurality of laser-generated features is covered by the paint.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

Figure 1:
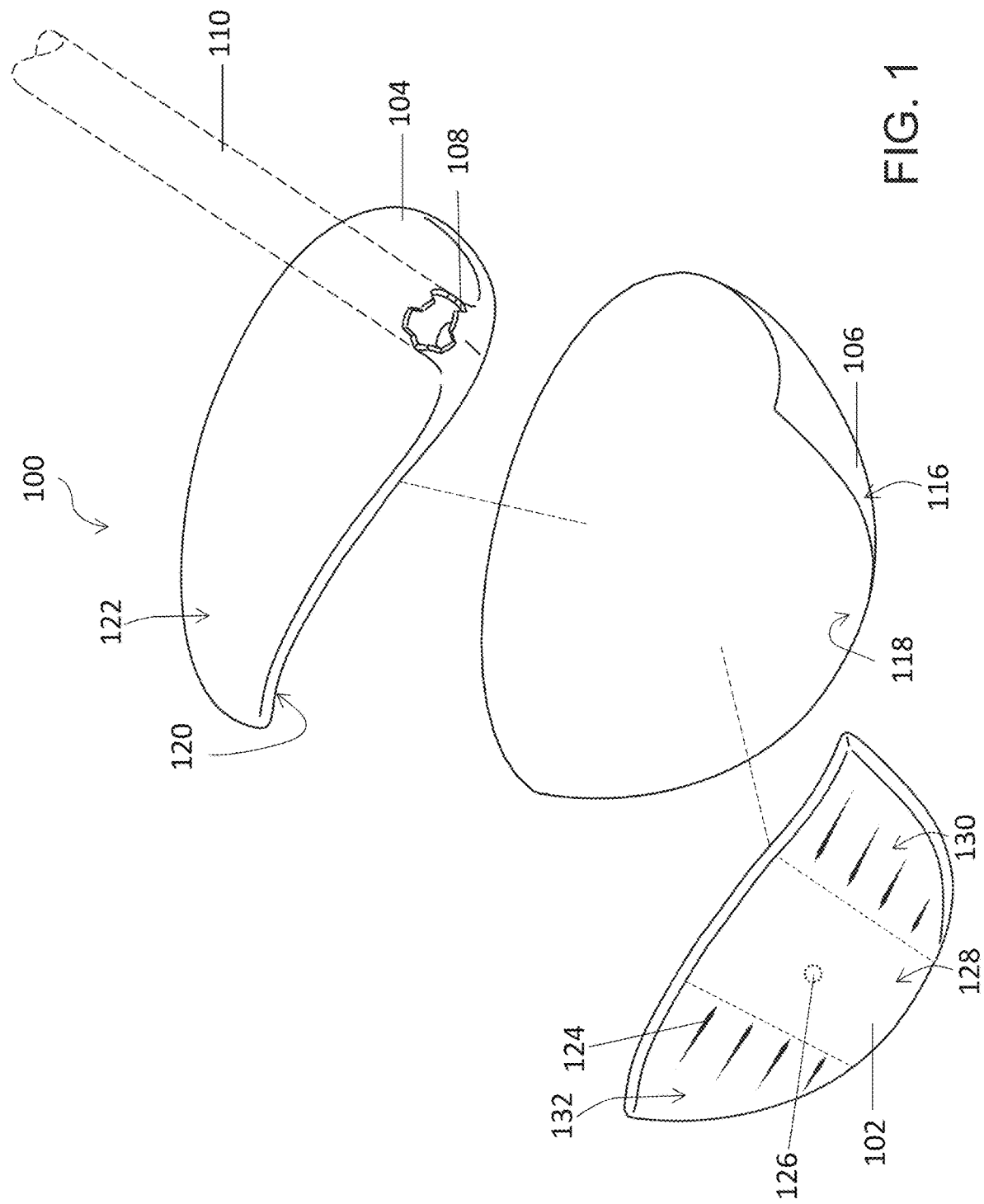
FIG. 1 depicts an exploded perspective view of a golf club head.

Understanding and seeing how a tool or sporting equipment, such as a golf club, is to be used increases the effectiveness of the tool. For instance, being able to see where a tool is in relation to an object to be struck is beneficial. Being able to see other aspects or characteristics of the impact surface is also useful in operating the tool. Seeing such features becomes particularly challenging, however, when the impact surface of the tool is difficult to see during use or can be seen only from a slight angle during use.

With a golf club, the impact surface is the club face of the golf club head. When a player addresses a golf ball with a golf club, the player is looking down at the golf club head and can clearly see the crown of the golf club head. For a driver or other low-loft golf club, however, the striking face is viewed at a narrow angle that causes difficulty in viewing the club face. Thus, properly perceiving the characteristics or features of the club face, such as the location of the sweet spot, the loft of the club face, the bulge of the club face, and/or the roll of the club face is challenging. Accordingly, players may struggle to properly align the golf club and ultimately properly strike the golf ball, resulting in lesser performance of the golf club head.

Examples of the present technology provide for laser-generated features that provide enhanced visual indicators of the characteristics of the club face, such as the sweet spot or optimal striking area. Thus, the player's ability to properly align the golf club head with the golf ball is enhanced, and the utility of the golf club head is improved. The laser-engraving and/or laser-marking process may also provide contrast between regions of the club face and/or contrast between the club face and the crown. The contrast may have an effect of improving the player's ability to see loft, bulge, and/or roll of the club face, which may improve the player's biomechanical response when using the golf club head—leading to further improved results.

The laser-generated features and contrast of the club face may be achieved through a combination of manufacturing processes. For example, the manufacturing process may include providing a coating or finish, such as a physical vapor deposition (PVD) coating, to the club face. The coating may darken the club face. Laser-generated features may be generated before and after the application of the coating. When the laser-generated features are applied subsequent to the coating, a laser engraving process removes the coating, which results in lightened features of the club face compared to the remainder of the club features. In other examples, the club face may not have a coating, and the laser-engraving or laser-marking process may be used to create darkened features on the club face. In either example, improvements to manufacturing processes may be achieved. For example, other manufacturing processes utilize masks prior to applying a PVD coating. The masking process is susceptible to human error in alignment of the mask. The masking process also introduces contamination into the PVD chamber, which leads to lower yields and potentially lower quality parts or components. With the laser-engraving and laser-marking process discussed herein, the masking process is no longer necessary. In addition, the laser engraving process allows for a more efficient and more precise process than the masking process.

FIG. 1 depicts an exploded perspective view of an example of a golf club head 100. The golf club head 100 includes a club face 102, a crown 104, and a sole 106. The club face 102 may comprise any type of club face, such as a face insert, a face cup, an L-cup, a C-cup, or other construction, without departing from the scope and content of the present disclosure. The club face 102 may be made from a titanium alloy or other metal. The crown 104 forms the top portion of the club head 100 and is generally made of a rigid material, such as a metal or a rigid composite. The crown 104 has an outer crown surface 122 and an inner crown surface 120. The sole 106 forms the bottom, or underside, portion of the golf club head 100 and is generally also made of a rigid material, such as a metal or a rigid composite. The sole 106 has an outer sole surface 116 and an inner sole surface 118. The crown 104, sole 106, and club face 102, when fitted together, define an interior void within the golf club head 100. The outer crown surface 122 and the outer sole surface 116 may also be coated with additional substances, such as paints, coatings or films. In addition, further structures or materials may also be attached to the outer crown surface 122 and the outer sole surface 116. Similarly, the inner crown surface 120 and the inner sole surface 118 may also be coated with additional substances, such as paints or coatings. The inner crown surface 120 and the inner sole surface 118 may also have structural materials, such as ribs or other components, attached to the surfaces. The golf club head 100 may also include a hosel 108 having components for attaching a shaft 110, as is well-understood by those having skill in the art. As used herein, the "heel" portion of the golf club is the portion of the golf club located closest to the hosel 108 and the "toe" portion of the golf club is the portion of the golf club furthest away from the hosel 108. While the figures generally depict a driver, the technology discussed herein is equally applicable to fairway metals, hybrid clubs, and other similar clubs containing both a crown, a club face, and a sole.

The club face 102 of the present technology includes one or more laser-generated features 124. The laser-generated features 124 may be generated through laser engraving, laser etching, and/or laser marking, as discussed further below. The laser-generated features 124 of the striking face provide an indication of the optimal locations on the club face 102 where a golf ball should be struck. For instance, the club face 102 has a "sweet spot" 126. The sweet spot 126 of the club face is the engineered best or optimal position for a golf ball strike to occur. The location, size, and shape of the sweet spot 126 may depend on the particular design of the golf club head 100. In some examples, the sweet spot 126 may be located in the geometric center of the striking face. In other examples, the sweet spot 126 may be located at a center point of the club face 102 between the toe portion and the heel portion, but the sweet spot 126 may be offset from a center point between the crown 104 and the sole 106. In different examples, the sweet spot 126 may be located at a center point between the crown 104 and the sole 106, but the sweet spot 126 may be offset from a center point between the toe portion and the heel portion. Other positions of locations of the sweet spot 126 are also possible.

In any of the preceding examples, the sweet spot 126 is located in a central region 128 of the club face 102. The central region 128 may be approximately the central third of the club face 102. A toe region 132 is located towards the toe portion of the club head 100 and adjacent to the central region 128. A heel region 130 is located towards the heel portion of the club head 100 and adjacent the central region 128. The laser-generated features 124 may be included in the heel region 130, the central region 128, and/or the toe region 132. The laser-generated features 124 are provided on the club face 102 to visually indicate the central region 128 of the club face 102. In some examples, the location of the sweet spot 126 may also be identified by the laser-generated features 124. The laser-generated features 124 may positively identify the central region 128 and/or sweet spot 126 by included laser-generated features 124 in those areas or to define the boundaries of those areas. The laser-generated features 124 may also be used to negatively identify the central region 128 and/or sweet spot 126 by including laser-generated features 124 in portions or regions of the club face 102 other than the central region 128 and/or sweet spot 126. For instance, in the example depicted in FIG. 1, laser-generated features 124 may be provided in the toe region 132 and the heel region 130 but not in the central region 128. In other examples, a first type of engraved feature or features may be included in the central region 128 and a second type of laser-generated features 124 may be provided in the toe region 132 and the heel region 130. In contrast to grooves or scorelines of the club head (not depicted), in some examples, the laser-generated features 124 may have little to no effect on the flight of a golf ball that is struck by the club head 100. That is, the depth of the laser-generated features 124 may be extremely small in comparison to a groove or scoreline.

Figure 2:
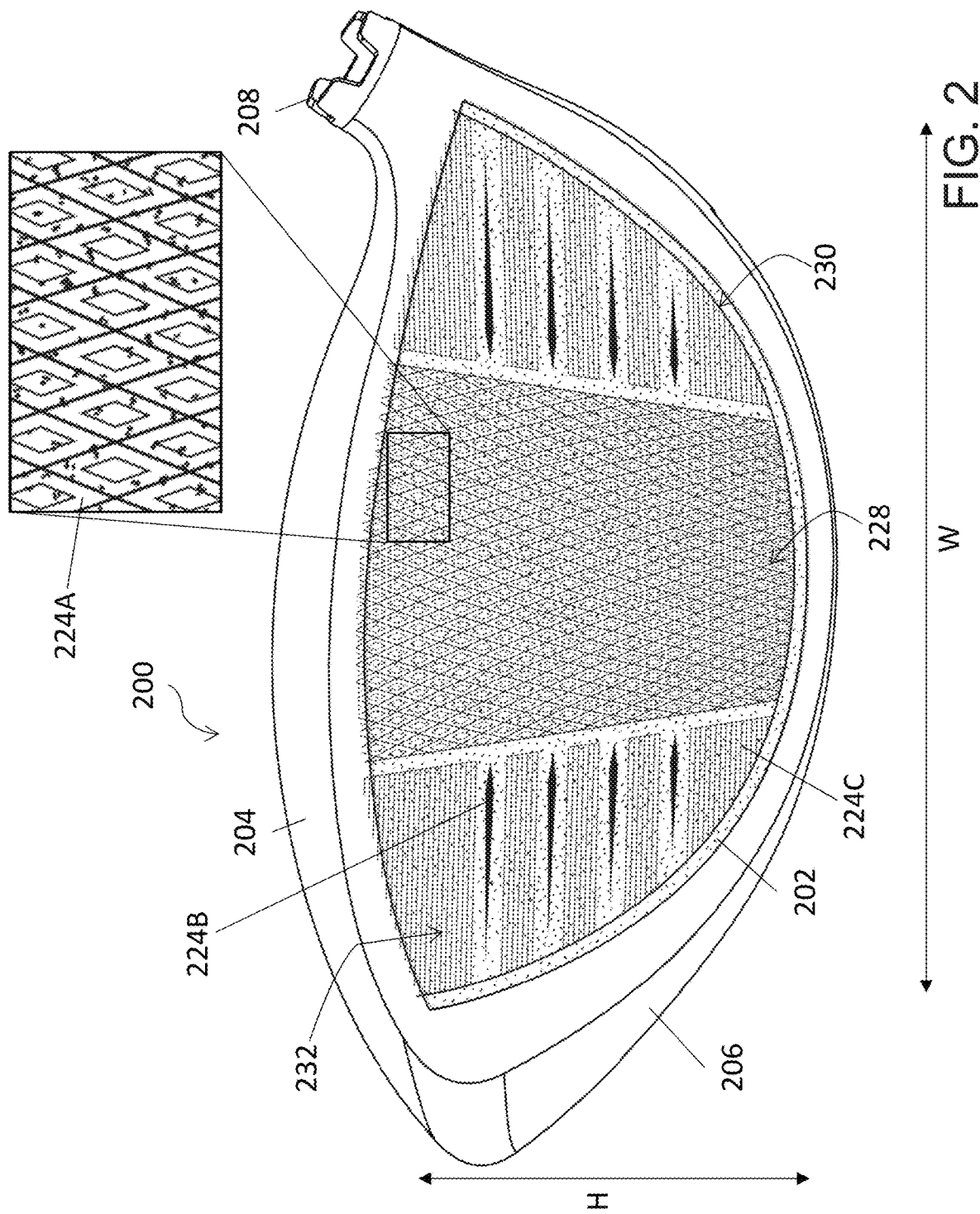
FIG. 2 depicts an example golf club head having a club face with laser-generated features.

FIG. 2 depicts an example golf club head 200 having a club face 202 with laser-generated features 224A-C. The golf club head has crown 204, a sole 206, a hosel 208, and a club face 202. The club face 202 has a maximum width W that is measured in a toe-to-heel direction parallel to the ground plane when the club is at address. The club face 202 also has a maximum height H, which is a maximum distance between two points on the face along a line orthogonal to the ground plane when club is at address. The width W and height H depicted in FIG. 2 indicate the measurement directions but may not be actual measurements of the club face 202. The club face 202 includes a central region 228, a heel region 230, and a toe region 232. The central region 228 may comprise approximately a central third of the club face 202. For example, the maximum width of the central region may be approximately one-third of the maximum width W of the club face 202. In other examples, the central region 228 may have a maximum width of at least 35%, 40%, 45%, or 50% of the width W of the club face 202. The maximum width of the central region 228 may be between 30-50% of the width W of the club face 202. The heel region 230 and the toe region 232 may have the same maximum width, which may be equal to half of the remaining width W of the club face 202 not comprised by the central region 228. The central region 228 extends the entire height H of the club face 202. Due to the shape of the club face 202, the heel region 230 and the toe region 232 may have heights that are less than the maximum height H of the club face 202.

The club face 202 includes a coating or finish, such as a physical vapor deposition (PVD) coating, which is indicated by the speckled dots on the club face 202. The coating may be applied before and/or after generating the laser-generated features 224A-C. When the laser-generated features 224A-C are generated subsequent to the coating being applied to the face, generating the laser-generated features 224A-C may include removing or vaporizing a portion of the coating.

The club face 202 includes a plurality of laser-generated features 224A-C that create contrast across the club face 202. The first plurality of laser-generated features 224A are included in the central region 228 of the club face 202. The first plurality of laser-generated features 224A are in the shape of diamonds; however, other shapes and designs are also possible. In examples, the particular shape of the features may be based on aesthetic choices. The first plurality of laser-generated features 224A may be generated before or after the application of the coating, such as a PVD coating. The laser process to generate the first plurality of laser-generated features 224A may also cause the laser-generated features 224A to be a particular color, such as blue. The first plurality of laser-generated features 224A may extend under the paint or coating of the crown 204. For instance, the first plurality of laser-generated features 224A may be provided on a region of the golf club head 200 that is later painted, coated, or covered with the same paint, coating, or covering that is used for the crown 204.

The first plurality of laser-generated features 224A are included across almost the entirety of the central region 228. Thus, the first plurality of laser-generated features 224A provide an aggregate contrast for the central region 228 as compared to the toe region 232 and the heel region 230. As an example, the first plurality of laser-generated features 224A may cover at least 50%, 60%, 70%, 80%, or 90% of the central region 228. By increasing the coverage of the central region 228 by the first plurality of laser-generated features 224A, the contrast effect is further enhanced, and the utility of the golf club is increased thus causing an improvement of the performance of the golf club head.

The coverage of the central region by the first plurality of laser-generated features 224A may be measured in multiple different manners. For example, an intersection-measurement method may be used where a determination is made at each height and/or width increment whether there is a laser-generated feature 224A. In a height-intersection measurement method, a determination is made for each height increment in the total height of the region whether there is a laser-generated feature 224A at the particular height increment. The height increment may be 1 mm or less, such as 0.1 mm. If there is a laser-generated feature 224A at the particular height increment, then the central region 228 is considered covered at that particular height increment. The coverage according to the height-intersection measurement method is the number of height increments that include a laser-generated feature 224A as compared to the total number of height increments, and such coverage is referred to herein as a height-intersection coverage. The height-intersection coverage may be expressed in the form of a percentage, fraction, or decimal expression. In the example depicted in FIG. 2, the only heights at which the central region 228 is not covered by the first plurality of laser-generated features 224A are heights of the club face 202 very near the sole. Accordingly, the height-intersection coverage of the central region 228 is at least 98%. In other examples, the height-intersection coverage of the central region 228 may be greater than 80%, 90%, or 95%, among other values.

A width-intersection measurement method may also be used. In a width-intersection measurement method, a determination is made for each width increment in the total width of the region whether there is a laser-generated feature 224A. The width increment may be 1 mm or less, such as 0.01 mm. If there is a laser-generated feature 224A at the particular width increment, then the central region 228 is considered covered at that particular width increment. The coverage according to the width-intersection measurement method is the number of width increments that include a laser-generated feature 224A as compared to the total number of width increments, and such coverage is referred to herein as a width-intersection coverage. The width-intersection coverage may be expressed in the form of a percentage, fraction, or decimal expression. In the example depicted in FIG. 2, each width increment of the central region 228 includes a laser-generated feature 224A. Accordingly, the width-intersection coverage of the central region 228 is 100%. In other examples, the width-intersection coverage of the central region 228 may be greater than 80%, 90%, or 95%, among other values.

A surface-area measurement method may also be used. In a surface-area measurement method, the surface area of the central region 228 that comprises a laser-generated feature 224A is compared to the total surface area of the central region 228. For instance, the surface area that has been laser marked, etched, and/or engraved is compared to the total surface area for the region. The coverage may be expressed in the form of a percentage, a fraction, or decimal expression, and such coverage is referred to herein as surface-area coverage. In the example depicted in FIG. 2, the surface-area coverage is less than the width-intersection coverage or the height-intersection coverage due to the width lines of the diamond pattern used. Thus, the surface-area coverage for the central region 228 may be greater than approximately 25%. The surface-area coverage changes based on the pattern of the first plurality of laser-generated features 224A and the line thickness of the features. For instance, in other examples, the surface-area coverage for the central region 228 may be at least 40%, 50%, 60%, 70% or greater.

The toe region 232 and the heel region 230 also include a second plurality of laser-generated features 224B and a third plurality of laser-generated features 224C. The second plurality of laser-generated features 224B may comprise spear-shaped features that point in a heel-to-toe direction. The third plurality of laser-generated features 224C may comprise line segments that run in a heel-to-toe direction. The third plurality of laser-generated features 224C may extend under the paint or coating of the crown 204. For instance, the third plurality of laser-generated features 224C may be provided on a region of the golf club head 200 that is later painted, coated, or covered with the same paint, coating, or covering that is used for the crown 204. The third plurality of laser-generated features 224C may also include a band that is contoured to match the shape of the lower boundary of the club face 202. That band may be offset from the perimeter of the club face 202 by an offset distance. The offset distance may be less than 5 mm, such as 2 mm. The offset may be from the perimeter of the club face 202 or from the edge of the club face area that is finished or coated, such as by a brushing process.

In examples, the particular shape of the laser-generated features 224B-C, such as a spear-shape, may be chosen based on aesthetic design choices. The overall contrast effect of the combination and coverage of the laser-generated features 224A-C, however, provides a functional benefit to the golf club head, as discussed above. The second plurality of laser-generated features 224B and the third plurality of laser-generated features 224C may be generated before and/or after the coating is applied to the club face 202. The coverage of toe region 232 and the heel region 230 by the laser-generated features 224B-C may be determined using the height-intersection measurement method, the width-intersection measurement method, and/or the surface-area measurement method. A height-intersection coverage, width-intersection coverage, and a surface-area coverage may be determined for the entire club face as well.

In one example for manufacturing the club face depicted in FIG. 2, the first plurality of laser-generated features 224A may be generated (e.g., laser engraved, etched, and/or marked) prior to the application of a black PVD coating. The second plurality of laser-generated features 224B and the third plurality of laser-generated features 224C may generated after the application of the black PVD coating. In other examples, all the laser-generated features 224A-C may be generated before or after the PVD coating. In yet other examples, a PVD coating may be applied only to the central region 228 or the toe region 232 and the heel region 230. In still other examples, the PVD coating may not be applied. Generating laser-generated features prior to the PVD coating may result in darker laser-generated features after they are coated with the dark PVD coating. Conversely, generating the laser-generated features subsequent to the application of the PVD coating may result in lighter laser-generated features. Thus, by having the laser-generated features in the center portion be generated prior to the PVD coating and having the laser-generated features in the toe portion and the heel portion generated after the PVD coating, additional contrast between the center region and the toe and heel regions may be achieved, which results in improved functionality of the golf club head.

Some example combinations of height-intersection coverage, width-intersection coverage, and surface area coverage are provided in the tables below.

| Example Club 1 | | | |
| --- | --- | --- | --- |
| Face Region | Height-Intersection Coverage | Width-Intersection Coverage | Surface-Area Coverage |
| Entire Face | >95% | >97% | >10% |
| Central Region | >95% | 100% | >15% |
| Toe Region | >60% | >95% | >5% |
| Heel Region | >60% | >95% | >5% |

| Example Club 2 | | | |
| --- | --- | --- | --- |
| Face Region | Height-Intersection Coverage | Width-Intersection Coverage | Surface-Area Coverage |
| Entire Face | >95% | >97% | >10% |
| Central Region | >95% | >95% | >15% |
| Toe Region | >95% | >60% | >5% |
| Heel Region | >95% | >60% | >5% |

Example Club 3

| Face Region | Height-Intersection Coverage | Width-Intersection Coverage | Surface-Area Coverage |
|---|---|---|---|
| Entire Face | >95% | >97% | >25% |
| Central Region | >95% | 100% | >40% |
| Toe Region | >60% | >95% | >10% |
| Heel Region | >60% | >95% | >10% |

Example Club 4

| Face Region | Height-Intersection Coverage | Width-Intersection Coverage | Surface-Area Coverage |
|---|---|---|---|
| Entire Face | >90% | >90% | >25% |
| Central Region | >90% | >90% | >40% |
| Toe Region | >90% | >60% | >10% |
| Heel Region | >90% | >60% | >10% |

Example Club 5

| Face Region | Height-Intersection Coverage | Width-Intersection Coverage | Surface-Area Coverage |
|---|---|---|---|
| Entire Face | >90% | >90% | >30% |
| Central Region | >90% | >90% | >60% |
| Toe Region | >60% | >90% | >20% |
| Heel Region | >60% | >90% | >20% |

Example Club 6

| Face Region | Height-Intersection Coverage | Width-Intersection Coverage | Surface-Area Coverage |
|---|---|---|---|
| Entire Face | >95% | >97% | >30% |
| Central Region | >95% | >95% | >60% |
| Toe Region | >95% | >60% | >20% |
| Heel Region | >95% | >60% | >20% |

Example Club 7

| Face Region | Height-Intersection Coverage | Width-Intersection Coverage | Surface-Area Coverage |
|---|---|---|---|
| Entire Face | >60% | >60% | >25% |
| Central Region | >80% | >80% | >40% |
| Toe Region | >40% | >40% | >10% |
| Heel Region | >40% | >40% | >10% |

Example Club 8

| Face Region | Height-Intersection Coverage | Width-Intersection Coverage | Surface-Area Coverage |
|---|---|---|---|
| Entire Face | >50% | >50% | >10% |
| Central Region | >50% | >30% | >15% |
| Toe Region | >30% | >30% | >5% |
| Heel Region | >30% | >30% | >5% |

FIGS. 3A-3F depict example golf club heads 300 having club faces with laser-generated features 324. Each of the golf club heads 300 include a club face 302, a crown 304, a sole 306, and a hosel 308. The laser-generated features 324 in each of the club faces 302, however, differ and provide a different contrast effect for the overall club face 302. The coverage of the club face 302 by the laser-generated features 324 may be within the ranges discussed above and in the above tables.

Figure 3A:
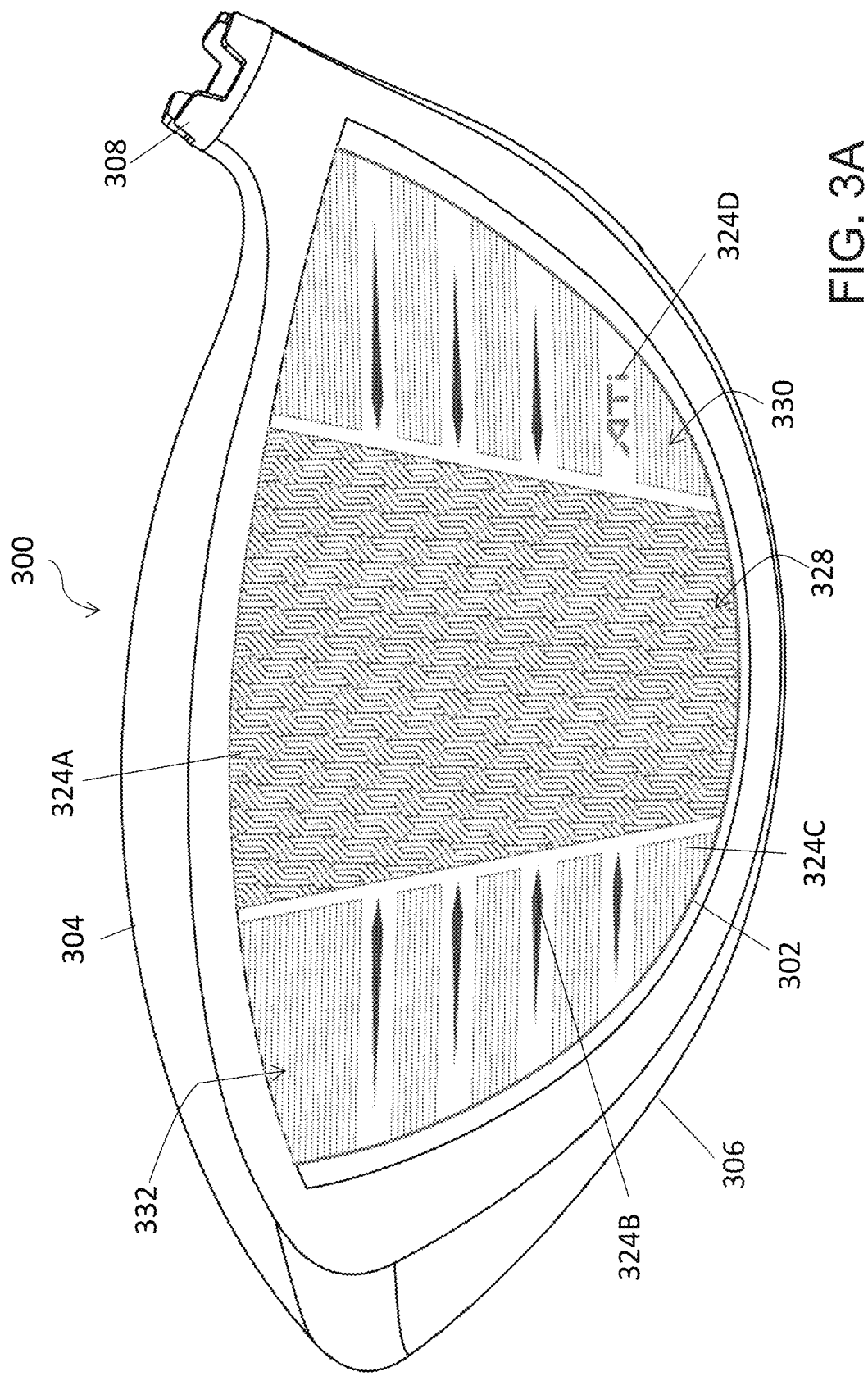
FIGS. 3A-3F depict example golf club heads having club faces with laser-generated features.

The example club face 302 of FIG. 3A includes laser-generated features 324 that are similar to the laser-generated features of the example golf club head 200 depicted in FIG. 2. For instance, the club face 302 in FIG. 3A includes a first plurality of laser-generated features 324A in a central region 328 of the club face 302. Rather than a diamond shape, the first plurality of laser-generated features 324A have an angled or chevron pattern. The club face 302 also includes a second plurality of laser-generated features 324B and a third plurality of laser-generated features 324C that are substantially similar to the second plurality of laser-generated features 224B and a third plurality of laser-generated features 224C discussed above with respect to FIG. 2. The club face 302 further includes a fourth laser-engraved feature 324D, which may be a logo or other indicia. The fourth laser-engraved feature 324D may be generated before or after the coating is applied.

Figure 3B:
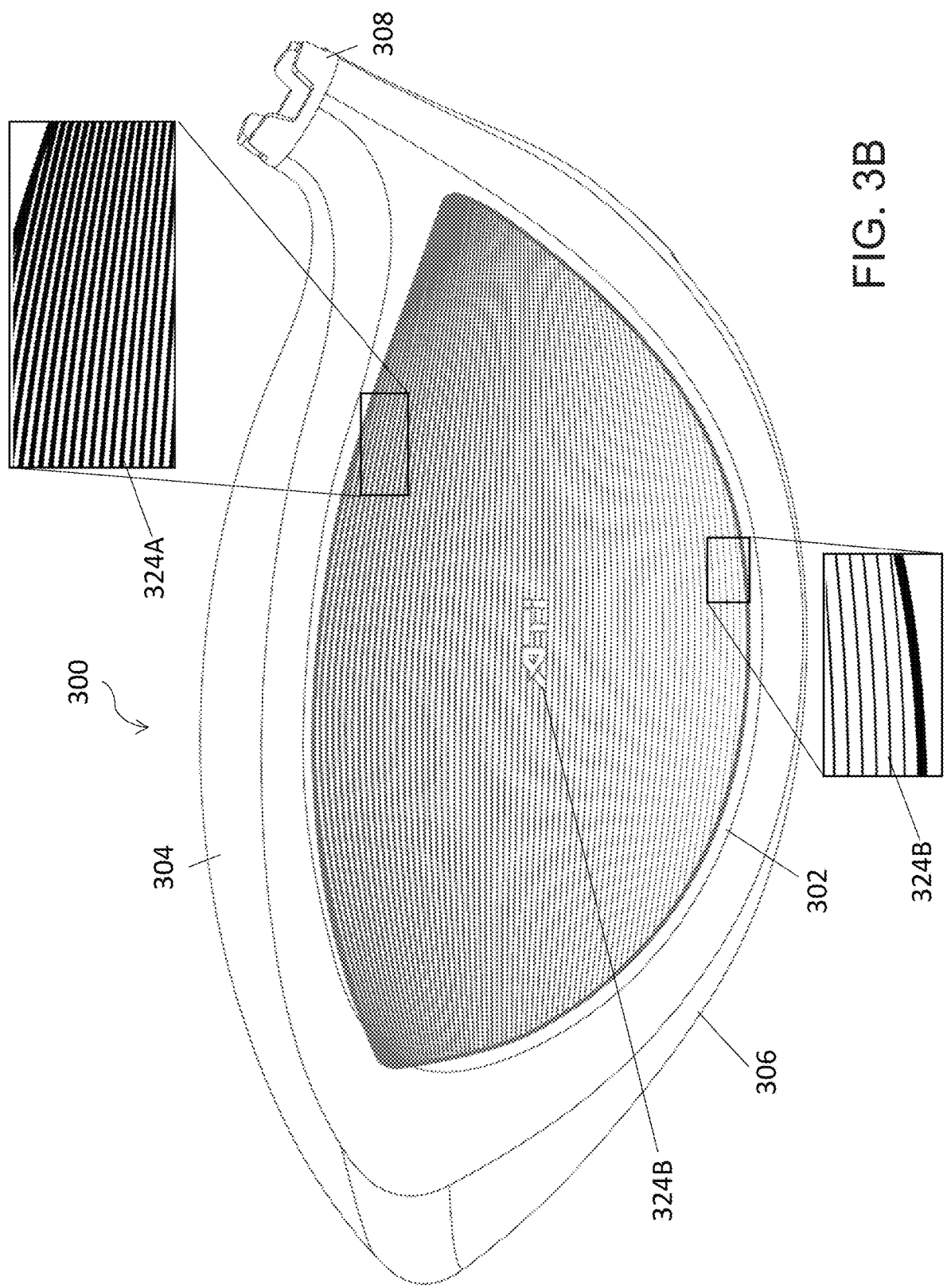

FIG. 3B depicts another example club face 302 with a first plurality of laser-generated features 324A and second laser-generated feature 324B. The first plurality of the laser-generated features 324A include lines that extend across the club face 302 in a heel-to-toe direction. The thickness of the first plurality of the laser-generated features 324 (e.g., the line thickness) may vary based on the position of the lines relative to the crown 304 and the sole 306. For instance, the first plurality of the laser-generated features 324A near the crown 304 are thicker than the first plurality of the laser-generated features 324 near the sole 306. The thickness of the laser-generated feature 324A nearest the crown 304 may be 0.4 mm and the thickness of the laser-generated feature nearest the sole 306 may be 0.1 mm. The ratio between the thickest laser-generated feature 324A and the thinnest laser-generated feature 324B may be between 2:1 to 6:1. In other examples, the change in thickness may be reversed such that the thinnest laser-generated feature 324A is near the crown 304 and the thickest laser-generated feature 324A is near the sole 306. The inclusion of the first plurality of laser-generated features may improve the functionality of the golf club head by allowing the player to better perceive the characteristics of the golf club head 300, such as the loft, bulge, and roll of the golf club head. The second laser-generated feature 324B may be a logo or other indicia. The first plurality of laser-generated features 324A do not overlap with the second laser-generated feature 324B.

Figure 3C:
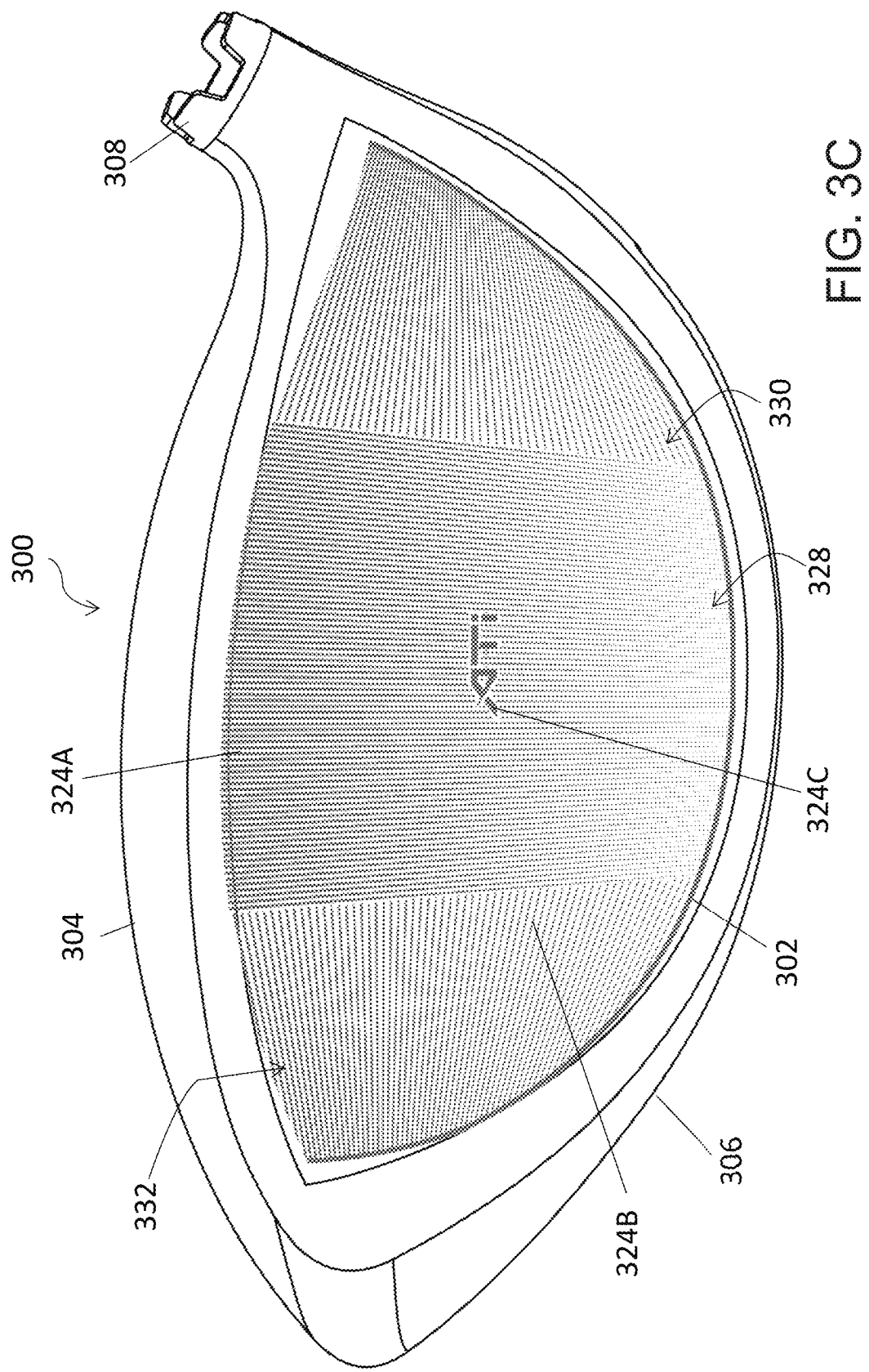

FIG. 3C depicts another example club face 302 with a first plurality of laser-generated features 324A and a second plurality of laser-generated features 324B. The first plurality of laser-generated features 324A are located in a central region 328 of the club face 302. The first plurality of laser-generated features 324A are formed as lines running in a crown-to-sole direction. The thickness of the first plurality of laser-generated features 324A may decrease from the crown 304 towards the sole 306. Thus, the thinnest portion of each of the laser-generated features 324A may be at a point nearest the sole 306 and thickest portion of each of the laser-generated features 324A may be at a point nearest the crown 304. The toe region 332 and the heel region 330 include a second plurality of laser-generated features 324B. The second plurality of laser-generated features 324B are substantially similar to the first plurality of laser-generated features depicted in FIG. 3B and described above. The central region 328 also includes a third laser-generated feature 324C that may be a logo or other indicia. The third laser-generated feature 324C may located at or near the sweet spot of the golf club to indicate the location of the sweet spot.

Figure 3D:
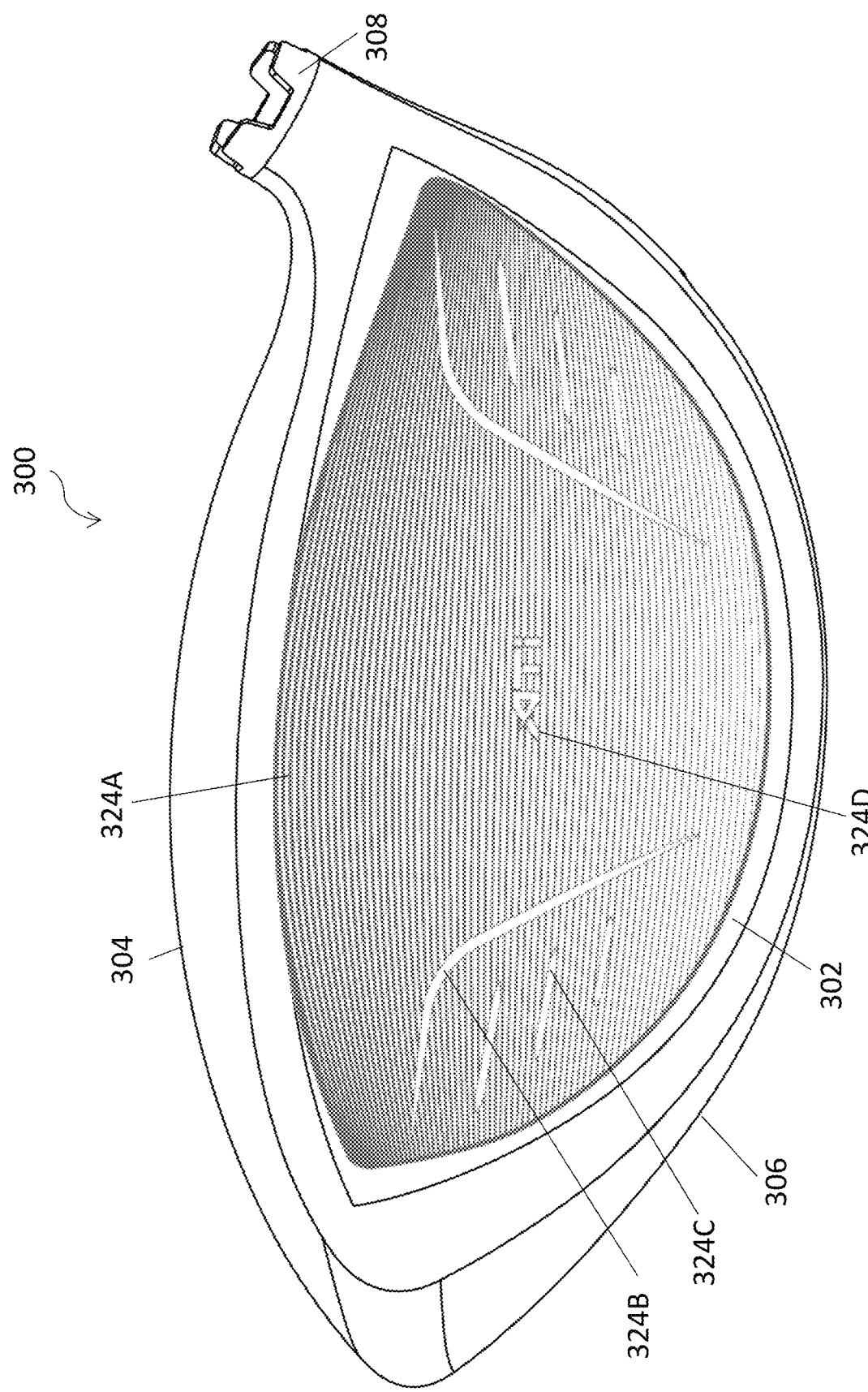

FIG. 3D depicts another example club face 302 with a first plurality of laser-generated features 324A that are substantially similar to the first plurality of laser-generated features 324A depicted in FIG. 3B and discussed above. The club face 302 also includes a second plurality of laser-generated features 324B and a third plurality of laser-generated features 324C. The second plurality of laser-generated features 324B may extend in multiple directions and be located to help identify the central region. The third plurality of laser-generated features 324C may be formed to appear more akin grooves or score lines of the golf club head 300. A fourth laser-generated feature 324D may be located at the sweet spot to indicate the location of the sweet spot.

Figure 3E:
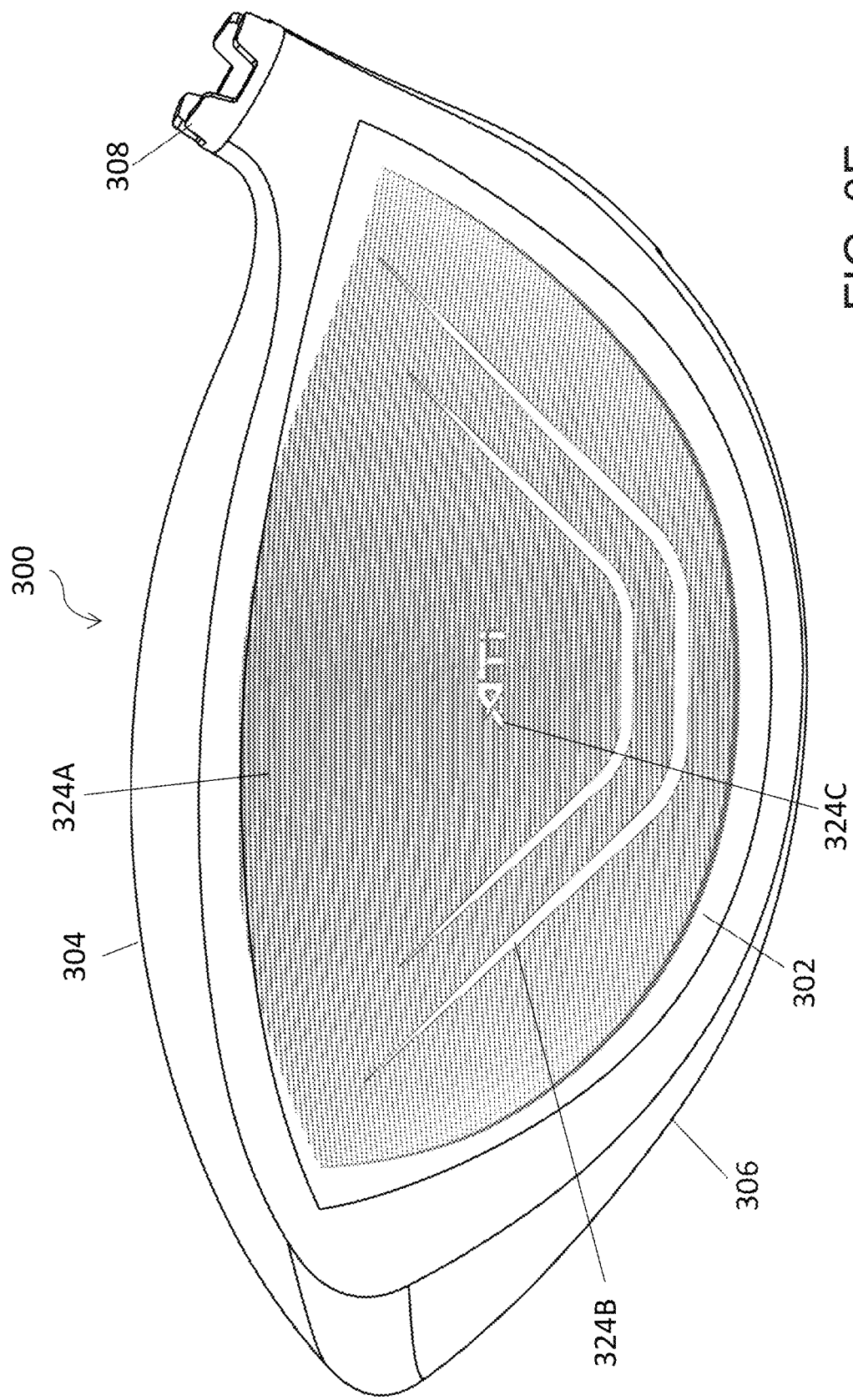

FIG. 3E depicts another example club face 302 having a first plurality of laser-generated features 324A, a second plurality of laser-generated features 324B, and a third laser-generated feature 324C. The first plurality of laser-generated features 324A may be similar to the first plurality of laser-generated features 324A depicted in FIG. 3B and discussed above. The first plurality of laser-generated features 324A in FIG. 3E, however, may have a consistent line thickness. The second plurality of laser-generated features 324B extend in a first direction in the central region and in a different direction in the toe region and the heel region. Accordingly, a player may be able to more easily identify the central portion and/or the center point of the width of the club face 302. The third laser-generated feature 324C may be located at the sweet spot to identify the sweet spot for the player.

Figure 3F:
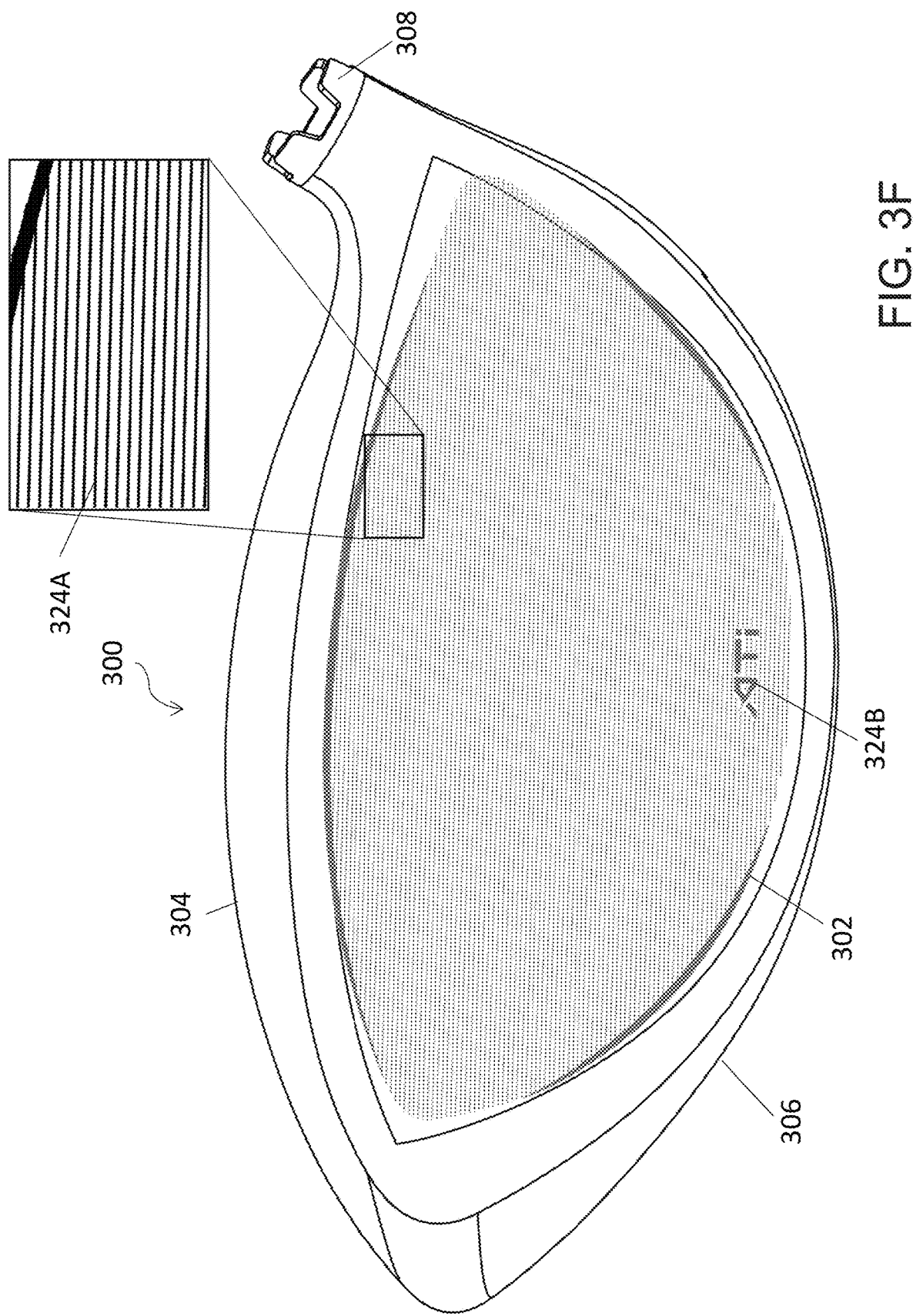

FIG. 3F depicts another example club face having a first plurality of laser-generated features 324A and a second laser-generated feature 324B. The laser-generated features 324 are formed as lines running in a heel-to-toe direction. Each of the first plurality of laser-generated features 324A has a consistent thickness. The second laser-generated feature 324B is located at a center width of the club face 302 to help the player identify the lateral geometric center of the club face 302 to provide more contrast on the face to help with alignment.

Figure 4:
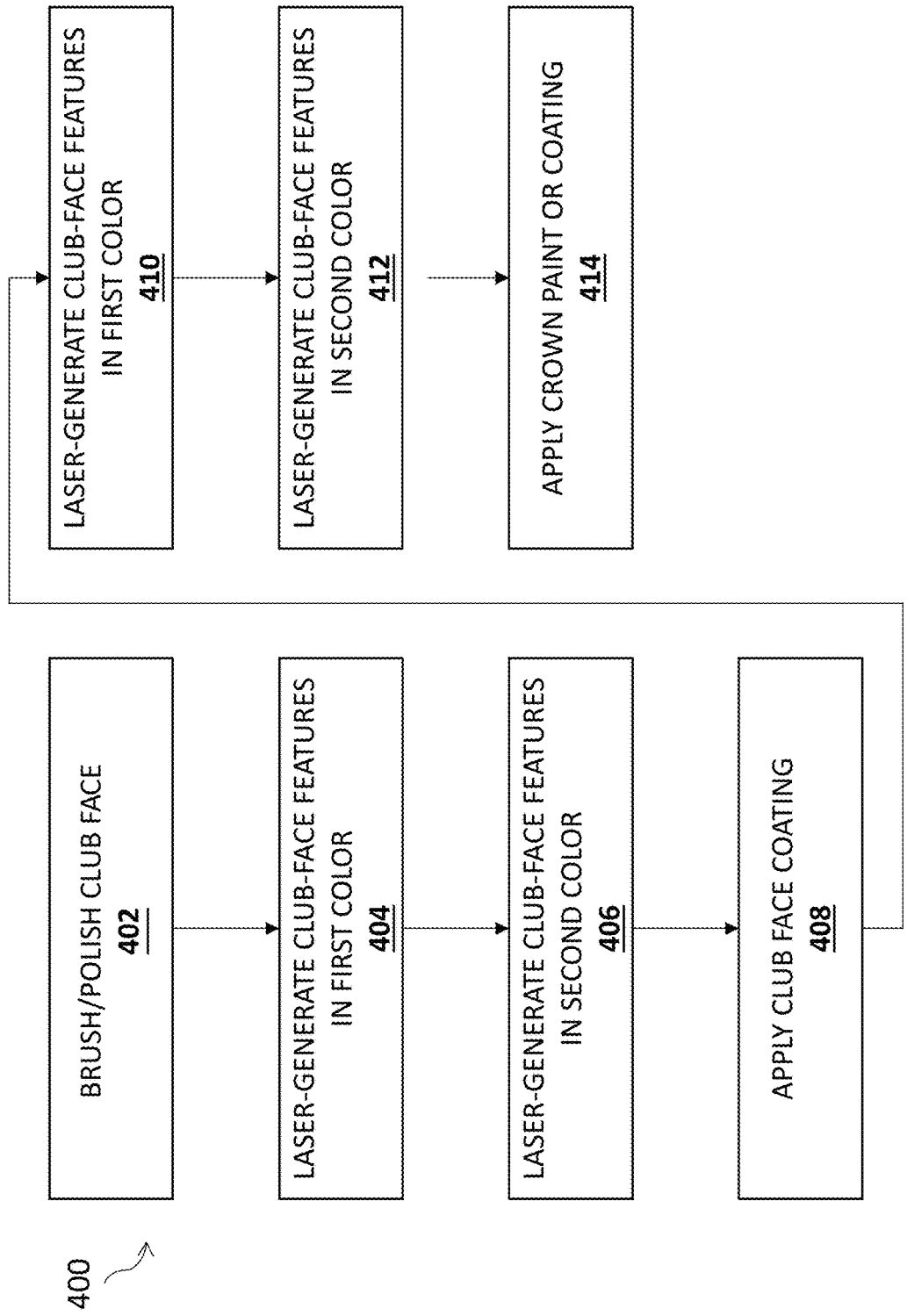
FIG. 4 depicts an example manufacturing method for manufacturing a golf club head with laser-generated features.

FIG. 4 depicts an example method 400 for manufacturing a golf club head. At operation 402, a club face for the golf club head is brushed and/or polished. The brushing and/or polishing process provides one type of initial finish on the club face. The brushing and/or polishing of the face may be a mechanical process and may be performed in a horizontal direction (e.g., in a heel-to-toe direction), a vertical direction (e.g., in a crown to sole direction), or another direction.

At operation 404, a first plurality of club-face features is laser-generated on the club face. The first plurality of laser-generated features may be any of the laser-generated features discussed above, among other possible laser-generated features. The first plurality of laser-generated features may be a first color. The first color may be gold, but other colors are also possible. The first set of laser-generated features may cover the majority of the surface of the central region. In other examples, the first set of laser-generated features may cover a majority of the surface of the toe region and/or the heel region. For example, the height-intersection coverage and the width-intersection coverage of the central region may be greater than 90%. By covering a majority of a particular region or regions, additional contrast between the regions may be generated. In addition, contrast between other components of the club head, such as the crown or hosel, may also be generated. The first plurality of laser-generated features is generated prior to the application of a coating, such as a PVD coating. Such an order of operations is contrary to previous methods, which generally performed any type of engraving after the application of a PVD. In addition, any such post-PVD engraving was on a smaller scale than what is provided by the present technology. Again, the scale at which the present laser-generated features is provided also previous methods that assumed that generating such large-scale, high-coverage features with a laser would be too time consuming and the heat generation during such a process may be too high, potentially causing damage to the underlying product.

Laser-generating a feature on the club face may be performed through a laser-etching process, a laser-engraving process, and/or a laser-marking process. The laser-engraving process and laser-etching process remove material from the face through the use of a laser beam generated from a laser source. The laser-engraving process uses high-power laser beam to heat and effectively vaporize material from the club face. In some examples, the depth of the laser-engraved features may be between 0 inches and 0.02 inches. The laser-etching process may be similar to the laser-engraving process, the laser-etching process may cause the material of the club face to melt. The melted material may expand to cause a raised mark. The depth of the laser-etched features may be between 0.000 and 0.001 inches.

The laser-marking process may discolor the material but may not remove any of the material (or remove a very small amount of material). The laser-marking process may use a lower power beam to create the change in color or discoloration of the club face. The laser-marking process may be an annealing process, a carbon migration process, and/or a coloration process. The annealing process may cause an oxidation of the metal due to the heat generated on the club face by the laser. The annealing process can create a darkened feature (such as a black feature) and may also be used to generate other color features, such as yellow, red, and green. The carbon migration technique cause carbon properties of the material to appear on the surface, creating a darker feature. The coloration process may change the color of the surface of the club face to a wide variety of colors. In some examples, the coloration process may be achieved via multiple different manners, such as laser oxidation that produces a thin oxide film on the metal surface that create color due to light interference occurring in the film, generating subwavelength nanoparticles, and/or structuring periodic gratings on the surface, among other manners. Generating the different colors on the surface of the club face may be based on changing the laser properties, such as laser frequency, power, speed, and/or focal distance, among other properties.

At operation 406, a second plurality of club-face features is laser-generated. The laser-generation process may be similar to the laser-generation process described above in operation 406. The second plurality of laser-generated features may be any of the laser-generated features described above, among other types of laser-generated features. The second set of laser-generated features may be for a second color. The second color may be blue, but other colors are also possible. To generate the second color, a separate laser may be utilized, or the characteristics of the same laser may be adjusted. For example, the focal length, time of exposure, and/or power of the laser may be adjusted to change the resultant color of the feature generated by the laser.

At operation 408, a coating is applied to the club face subsequent to the first plurality of laser-generated features and the second plurality of laser generated features being generated on the club face. The coating may be a PVD coating among other types of coating. A PVD coating may be used to darken the club face. The thickness of the coating may be set such that the first plurality and second plurality of laser-generated features may still be seen, at least partially, through the coating.

At operation 410, subsequent to the application of the coating, a third plurality of club face features are laser generated on the club face. The third plurality of laser-generated features may be any of the laser-generated features described above, among other possible features. The third plurality of laser-generated features may be of the same color as the first plurality of laser-generated features that were generated in operation 404. Laser-generating the features subsequent to the coating may cause the coating to be removed or vaporized by the laser beam. Where the coating is a dark coating, such as a black PVD, the laser-generation process lightens portion of the club face where the laser beam is directed by removing the dark coating. At operation 412, also subsequent to the application of the coating, a fourth plurality of club-face features is laser-generated. The fourth plurality of laser-generated features may be any of the laser-generated features described above, among other possible features. The fourth plurality of laser-generated may be the same color as the first plurality of laser generated features.

Subsequent to the laser-generated features being manufactured on the club face, at operation 414, paint or another coating is added to one or more components of the club head, such as the crown. The paint may cover a portion of the laser-generated features, such as a portion of the laser-generated features located near the crown.

Some aspects of the present disclosure are described above with reference to block diagrams. The functions, operations, and/or acts noted in the blocks may occur out of the order that is shown in any respective flowchart. For example, two blocks shown in succession may in fact be executed or performed substantially concurrently or in reverse order, depending on the functionality and implementation involved.

This disclosure describes some embodiments of the present technology with reference to the accompanying drawings, in which only some of the possible embodiments were shown. Other aspects may, however, be embodied in many different forms and should not be construed as limited to the embodiments set forth herein. Rather, these embodiments were provided so that this disclosure was thorough and complete and fully conveyed the scope of the possible embodiments to those skilled in the art. Further, as used herein and in the claims, the phrase "at least one of element A, element B, or element C" is intended to convey any of: element A, element B, element C, elements A and B, elements A and C, elements B and C, and elements A, B, and C. Further, one having skill in the art will understand the degree to which terms such as "about" or "substantially" convey in light of the measurement techniques utilized herein. To the extent such terms may not be clearly defined or understood by one having skill in the art, the term "about" shall mean plus or minus ten percent.

Although specific embodiments are described herein, the scope of the technology is not limited to those specific embodiments. Moreover, while different examples and embodiments may be described separately, such embodiments and examples may be combined with one another in implementing the technology described herein. One skilled in the art will recognize other embodiments or improvements that are within the scope and spirit of the present technology. Therefore, the specific structure, acts, or media are disclosed only as illustrative embodiments. The scope of the technology is defined by the following claims and any equivalents therein.

The invention claimed is:

1. A method for manufacturing a golf club head, the method comprising:
   generating, by one or more lasers, a first plurality of laser-generated features on a central region of a club face, wherein the first plurality of laser-generated features provide at least two of a height-intersection coverage of the central region of at least 90%, a width-intersection coverage of the central region of at least 90%, or a surface-area coverage of the central region of at least 50%;
   applying a coating to the club face such that the coating covers the central region, the first plurality of laser-generated features, a toe region of the golf club head, and a heel region of the golf club head;
   removing, by the one or more lasers, a portion of the coating on the toe region to form a second plurality of laser-generated features on the toe region of the club face, wherein the second plurality of laser-generated features are different from the first plurality of laser-generated features, do not overlap with the first plurality of laser-generated features, and are spaced apart, in a heel-to-toe direction, from the first plurality of laser-generated features; and
   removing, by the one more lasers, a portion of the coating on the heel region to form a third plurality of laser-generated features on the heel region of the club face, wherein the third plurality of laser-generated features are different from the first plurality of laser-generated features, do not overlap with the first plurality of laser-generated features, and are spaced apart, in a heel-to-toe direction, from the first plurality of laser-generated features.

2. The method of claim 1, wherein the coating is a physical vapor deposition (PVD) coating and the first plurality of laser-generated features appear darker than the second plurality of laser-generated features, thereby creating contrast between the central region and the toe region.

3. The method of claim 1, wherein the height-intersection coverage of the central region is at least 90% and the width-intersection coverage of the central region is at least 90%.

4. The method of claim 1, further comprising configuring the one or more lasers to have laser properties that cause the second plurality of laser-generated features to be formed as a gold color due to exposure to a laser beam from the one or more lasers, the laser properties including at least one of laser frequency, power, speed, or focal distance.

5. The method of claim 1, wherein the club face has a maximum width in a heel-to-toe direction, and the central region has a maximum width between 30-50% of the maximum width of the club face.

6. The method of claim 1, wherein the surface-area coverage of the central region is at least 50%.

7. The method of claim 1, wherein the club face does not include any grooves or scorelines.

8. The method of claim 1, wherein:
   the first plurality of laser-generated features provide a height-intersection coverage of the central region of at least 95% and a width-intersection coverage of the central region of at least 95%;
   the second plurality of laser-generated features extend in a heel-to-toe direction;

the second plurality of laser-generated features provide a width-intersection coverage of the toe region of at least 90%;

the third plurality of laser-generated features provide a width-intersection coverage of the heel region of at least 90%; and a combination of the first plurality of laser-generated features, the second plurality of laser-generated features, and the third plurality of laser-generated features provide a width-intersection coverage of the entire face of at least 90%.

9. The method of claim 1, wherein the height-intersection coverage is measured using a height increment of 1 mm or less, and wherein the width-intersection coverage is measured using a width increment of 1 mm or less.

10. A method for manufacturing a golf club head, the method comprising:

generating a first plurality of features on a central region of a club face, wherein the first plurality of features provide at least two of a height-intersection coverage of the central region of at least 90%, a width-intersection coverage of the central region of at least 90%, or a surface-area coverage of the central region of at least 50%;

applying a coating to the club face such that the coating covers the central region, the first plurality of features, a toe region of the golf club head, and a heel region of the golf club head;

removing a portion of the coating on the toe region to form a second plurality of features on the toe region of the club face, wherein the second plurality of features are different from the first plurality of features, do not overlap with the first plurality of features, and are spaced apart, in a heel-to-toe direction, from the first plurality of features; and removing a portion of the coating on the heel region to form a third plurality of features on the heel region of the club face, wherein the third plurality of features are different from the first plurality of features, do not overlap with the first plurality of features, and are spaced apart, in a heel-to-toe direction, from the first plurality of features.

11. The method of claim 10, wherein the coating is a PVD coating and the first plurality of features appear darker than the second plurality of features, thereby creating contrast between the central region and the toe region.

12. The method of claim 10, wherein the height-intersection coverage of the central region is at least 90% and the width-intersection coverage of the central region is at least 90%.

13. The method of claim 10, wherein the second plurality of features to be formed as a gold color have a color different from the first plurality of features.

14. The method of claim 10, wherein the club face has a maximum width in a heel-to-toe direction, and the central region has a maximum width between 30-50% of the maximum width of the club face.

15. The method of claim 10, wherein the surface-area coverage of the central region is at least 50%.

16. The method of claim 10, wherein the club face does not include any grooves or scorelines.

17. The method of claim 10, wherein:

the first plurality of features provide a height-intersection coverage of the central region of at least 95% and a width-intersection coverage of the central region of at least 95%;

the second plurality of features extend in a heel-to-toe direction;

the second plurality of features provide a width-intersection coverage of the toe region of at least 90%;

the third plurality of features provide a width-intersection coverage of the heel region of at least 90%; and a combination of the first plurality of features, the second plurality of features, and the third plurality of features provide a width-intersection coverage of the entire face of at least 90%.

18. The method of claim 10, wherein the height-intersection coverage is measured using a height increment of 0.1 mm, and wherein the width-intersection coverage is measured using a width increment of 0.1 mm.

19. A method for manufacturing a golf club head, the method comprising:

generating, by one or more lasers, a first plurality of laser-generated features on a central region of a club face, wherein the first plurality of laser-generated features provide a height-intersection coverage of the central region of at least 90%, a width-intersection coverage of the central region of at least 90%, or a surface-area coverage of the central region of at least 50%, wherein the height-intersection coverage is measured using a height increment of 0.1 mm, and wherein the width-intersection coverage is measured using a width increment of 0.1 mm;

applying a coating to the club face such that the coating covers the central region, the first plurality of laser-generated features, a toe region of the golf club head, and a heel region of the golf club head;

removing, by the one or more lasers, a portion of the coating on the toe region to form a second plurality of laser-generated features on the toe region of the club face, wherein the second plurality of laser-generated features are different from the first plurality of laser-generated features, do not overlap with the first plurality of laser-generated features, and are spaced apart, in a heel-to-toe direction, from the first plurality of laser-generated features; and removing, by the one more lasers, a portion of the coating on the heel region to form a third plurality of laser-generated features on the heel region of the club face, wherein the third plurality of laser-generated features are different from the first plurality of laser-generated features, do not overlap with the first plurality of laser-generated features, and are spaced apart, in a heel-to-toe direction, from the first plurality of laser-generated features.

20. The method of claim 19, wherein the club face does not include any grooves or scorelines.

* * * * *